(12) United States Patent
Plat et al.

(10) Patent No.: US 6,586,339 B1
(45) Date of Patent: Jul. 1, 2003

(54) SILICON BARRIER LAYER TO PREVENT RESIST POISONING

(75) Inventors: Marina V. Plat, San Jose, CA (US); Robert Ogle, San Jose, CA (US); Lewis Shen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 122 days.

(21) Appl. No.: 09/428,918

(22) Filed: Oct. 28, 1999

(51) Int. Cl.[7] .............................................. H01L 21/302
(52) U.S. Cl. ....................... 438/706; 438/710; 438/712
(58) Field of Search ................................. 438/706, 710, 438/712, 745, 750, 754, 265, 270, 283, 287

(56) References Cited

U.S. PATENT DOCUMENTS 5,773,199 A  *  6/1998 Linliu et al. ................ 430/316
5,792,708 A  *  8/1998 Zhou et al. .................. 438/647
5,856,225 A  *  1/1999 Lee et al. .................... 438/291

* cited by examiner

*Primary Examiner*—Benjamin L. Utech
*Assistant Examiner*—Lan Vinh

(57) ABSTRACT

A thin barrier layer of undoped silicon is formed on an ARC to prevent resist poisoning and footing. The silicon layer can be removed with improved yield and high selectivity with respect to the underlying gate dielectric layer, thereby avoiding degradation of the gate dielectric layer. Embodiments include forming a silicon oxynitride ARC on a polycrystalline silicon layer overlying a silicon oxide layer, depositing a thin undoped polycrystalline or amorphous silicon barrier layer on the ARC, forming a photoresist mask on the barrier layer, etching to form a gate electrode on a gate oxide layer and removing the photoresist mask. The undoped polycrystalline or amorphous silicon barrier layer is then removed employing conventional wet or dry etching techniques with high etch selectivity to the underlying gate oxide layer, thereby avoiding degradation of the gate oxide layer.

8 Claims, 1 Drawing Sheet

SILICON BARRIER LAYER TO PREVENT RESIST POISONING

FIELD OF THE INVENTION

The present invention relates to a method of manufacturing a semiconductor device having sub-micron features. The present invention has particular applicability in manufacturing semiconductor devices with a design rule of about 0.15 micron and under having accurately dimensioned gate electrodes with a highly reliable gate dielectric layer thereunder.

BACKGROUND ART

The escalating requirements for high density and performance associated with ultra-large scale integration require responsive changes in various aspects of semiconductor manufacturing techniques. Implementation becomes problematic in manufacturing semiconductor devices having a design rule of about 0.18 micron and under, such as, about 0.15 micron and under, e.g., about 0.12 micron and under.

Semiconductor devices typically comprise a substrate and elements, such as transistors and/or memory cells, thereon. Various interconnection layers are formed on the semiconductor substrate to electrically connect these elements to each other and to external circuits. The formation of interconnection layers and transistor structures is partly accomplished employing conventional photolithographic techniques to form a photoresist mask comprising a pattern and transferring the pattern to an underlying layer or composite by etching the exposed underlying regions.

In accordance with conventional practices, a gate electrode structure is formed by initially forming a thin dielectric layer, such as a silicon oxide layer on a semiconductor substrate, and depositing a conductive layer thereon, such as doped polycrystalline silicon. An anti-reflective coating (ARC) is formed on the conductive layer and a photoresist mask is formed on the ARC. The ARC is typically provided between the photoresist and conductive layers to avoid deleterious reflections from the underlying conductive layer during patterning of the photoresist. ARCs are chosen for their optical properties and compatibility with the underlying conductive layer. However, many ARCs, such as titanium nitride, silicon nitride, and silicon oxynitride, contain basic components, such as nitrogen, which adversely interact with the photoresist material thereon during photolithographic processing, particularly in conventional deep ultra violet (deep-UV) resist processing, e.g., deep-UV radiation having a wavelength of about 100 nm to about 300 nm.

A conventional gate electrode structure is illlustrated in FIG. 1 and comprises substrate 8 and dielectric layer 10 thereon, e.g., silicon dioxide. A conductive layer 12, e.g., doped polycrystalline silicon, is formed on dielectric layer 10 and ARC 14, e.g., silicon oxynitride, is formed on conductive layer 12. A photoresist layer 16 is formed on ARC 14.

Photoresist coating 16 is typically a deep-UV radiation sensitive photoresist capable of achieving line width resolutions of about 0.15 micron. During photolithographic processing, radiation is passed through mask 18 defining a desired gate electrode pattern to imagewise expose photoresist coating 16. After exposure to radiation, the photoresist layer is developed to form a relief pattern therein. It has been observed, however, that a residue remains at the photoresist interface and ARC, near the developed photoresist sidewall, resulting in a parabolic appearance 22a and 22b at the base of the photoresist known as "footing", as shown in FIG. 2, wherein elements similar to those in FIG. 1 are denoted by similar reference numerals. In FIG. 2, reference numeral 20 denotes the photoresist mask. The footing problem is typical of conventional photolithographic techniques employing a photoresist coating over an ARC in forming gate electrode structures, e.g., single or dual gate structures. Footing of the photoresist during patterning, believed to be caused by photoresist poisoning, results in a loss of critical dimensional control in the subsequently patterned gate electrode.

A conventional approach to the footing problem illustrated in FIG. 2 comprises the formation of a hard mask, such as silicon oxide derived from tetraethyl orthosilicate (TEOS), on the silicon oxynitride ARC to prevent interaction of a basic component, e.g., nitrogen, in the ARC with the deep-UV photoresist mask. However, subsequent to patterning the underlying gate electrode and gate dielectric layer, the hard mask is removed employing a hydrofluoric acid dip prior to removing the ARC by stripping with phosphoric acid. It was found that the hydrofluoric acid dip employed to remove the hard mask, e.g., silicon dioxide, damages the underlying gate dielectric layer, e.g., silicon dioxide layer. As miniaturization proceeds apace and gate dielectric layers become thinner and thinner, the degradation of the gate dielectric layer by hydrofluoric acid attack during removal of the hard mask becomes acutely problematic.

Accordingly, there exists a need for methodology enabling patterning of a gate electrode structure, particularly with deep-UV photoresist techniques, with improved dimensional accuracy and without degradation of the underlying gate dielectric layer.

SUMMARY OF THE INVENTION

An advantage of the present invention is a method of accurately patterning a conductive layer, such as polycrystalline silicon, to form an accurately dimensioned gate electrode structure without degrading the performance characteristics of the underlying gate dielectric layer.

Additional advantages and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a conductive layer on a dielectric layer; forming an anti-reflective coating (ARC) on the conductive layer; forming an undoped silicon barrier layer on the ARC; forming a photoresist mask on the barrier layer; etching to pattern the conductive layer and dielectric layer forming a gate electrode on a gate dielectric layer; removing the photoresist mask; and etching to remove the barrier layer with high etch selectivity to the gate dielectric layer.

Embodiments of the present invention comprise forming a doped polycrystalline silicon layer on a silicon dioxide layer, forming a silicon oxynitride ARC on the polycrystalline silicon layer, and forming an undoped polycrystalline or amorphous silicon barrier layer, having a thickness of about 10 Å to about 100 Å, on the ARC, forming a photoresist mask on the barrier layer, patterning the gate electrode structure, removing the photoresist mask, stripping the barrier layer with high etch selectivity to the underlying silicon dioxide layer, and removing the ARC.

Additional advantages of the present invention will become readily apparent to those skilled in the art from the following detailed description, wherein only the preferred embodiment of the present invention is shown and described, simply by way of illustration of the best mode contemplated for carrying out the present invention. As will be realized, the present invention is capable of other and different embodiments, and its' several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves the problem of gate dielectric layer degradation attendant upon removing a hard mask, e.g., silicon oxide, from an ARC after photolithographic processing and patterning. The hard mask is conventionally removed with hydrofluoric acid which degrades the underlying gate dielectric layer. According to embodiments of the present invention, degradation of the underlying gate dielectric layer during deep UV photolithographic processing is prevented by employing undoped silicon, e.g., polycrystalline or amorphous silicon, as a barrier layer in lieu of the conventional hard mask on the ARC underlying the photoresist mask.

The undoped silicon barrier layer according to embodiments of the present invention effectively prevents resist poisoning and, hence, footing. Moreover, the undoped silicon barrier layer is resistant to thinning during removal. Advantageously, the undoped silicon barrier layer in accordance with the present invention can be effectively stripped without adversely impacting the integrity of the gate dielectric layer with high etch selectivity with respect to the underlying gate dielectric layer. Thus, the use of an undoped silicon barrier layer on the ARC improves yield and gate dielectric layer reliability.

Figure 1:
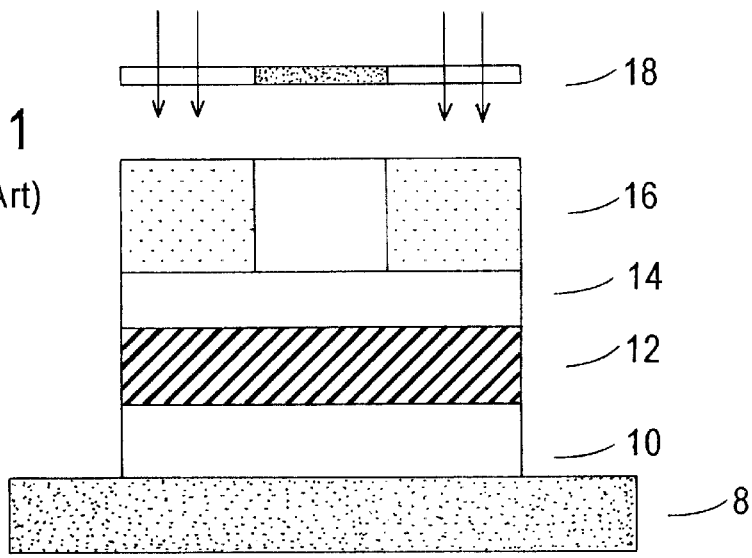
FIG. 1 schematically illustrates a conventional gate electrode structure prior to radiation exposure.
Figure 2:
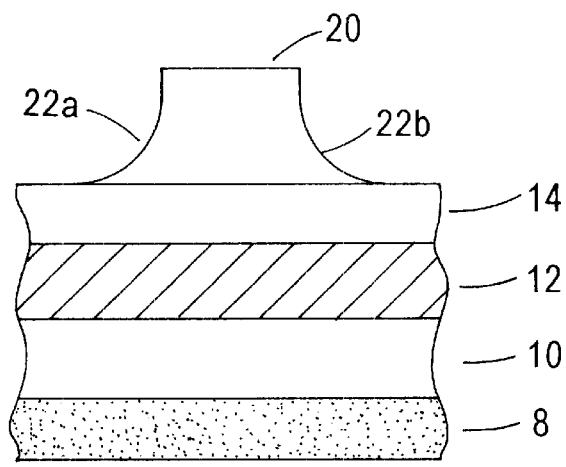
FIG. 2 schematically illustrates a conventional gate electrode structure.
Figure 3:
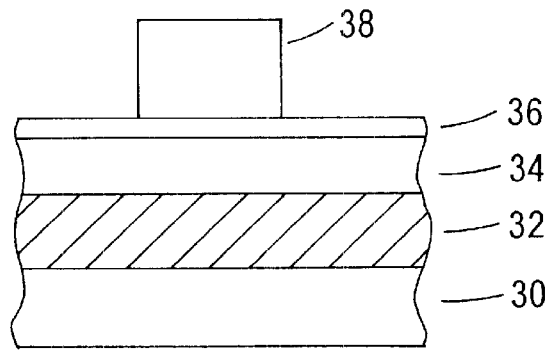
FIG. 3 illustrates an embodiment of the present invention.

An embodiment of the present invention is schematically illustrated in FIG. 3 and comprises gate dielectric layer 30, e.g., silicon dioxide, and conductive layer 32, e.g., doped polycrystalline silicon, formed on gate oxide layer 30. An ARC 34, e.g., silicon oxynitrite, is formed on the upper surface of doped polycrystalline silicon layer 32. In accordance with embodiments of the present invention, a thin barrier layer 36 is formed on silicon oxynitrite ARC 34. Barrier layer 36 can comprise undoped silicon, e.g., polycrystalline or amorphous silicon, as at a thickness of about 10 Å to about 100 Å. The photoresist mask is then formed on barrier layer 36. A photoresist mask typically comprises materials sensitive to deep UV radiation. The layers are formed in a conventional manner. For example, gate oxide layer 30 can be thermally formed. The additional layers 32, 34, 36 are deposited employing conventional chemical vapor deposition techniques.

Subsequent to patterning, the photoresist mask 38 is removed in a conventional manner. Barrier layer 36 is then removed, as by etching, employing an etch recipe with high etch selectivity with respect to the underlying gate dielectric layer 30. Such etching recipes are conventional. For example, a plasma containing $SF_6$ and chlorine. The silicon oxynitrite ARC 34 is then removed in a conventional manner, as by stripping with phosphoric acid.

The present invention provides efficient methodology to accurately pattern gate electrode stacks without a loss of critical dimension and without degradation of the performance characteristics of the underlying gate dielectric layer. The present invention enjoys industrial utility in manufacturing any of various types of semiconductor devices, particularly semiconductor devices having a design rule in the deep submicron range. The present invention advantageously enables manufacturing semiconductor devices employing deep UV photoresist technology without footing, with superior etch marginality and with improved performance characteristics.

Only the preferred embodiment of the present invention and an example of its versatility is shown and described in the present disclosure. It is to be understood that the present invention is capable of use in various combinations and environments, and is capable of changes or modifications within the scope of the inventive concept as expressed herein.

What is claimed is:

1. A method of manufacturing a semiconductor device, the method comprising:
   forming a conductive layer on a dielectric layer;
   forming an anti-reflective coating (ARC) on the conductive layer;
   forming an undoped silicon barrier layer on the ARC;
   forming a photoresist mask on the barrier layer;
   etching to pattern the conductive layer and dielectric layer forming a gate electrode on a gate dielectric layer;
   removing the photoresist mask; and
   etching to remove the barrier layer with high etch selectivity to the gate dielectric layer.

2. The method according to claim 1, further comprising stripping the ARC.

3. The method according to claim 1, wherein:
   the conductive layer and gate electrode comprise polycrystalline silicon; and
   the dielectric layer and gate dielectric layer comprise silicon oxide.

4. The method according to claim 3, wherein the ARC comprises silicon oxynitride.

5. The method according to claim 4, comprising the stripping of the ARC with phosphoric acid.

6. The method according to claim 1, wherein the barrier layer comprises polycrystalline silicon.

7. The method according to claim 1, wherein the barrier layer comprises amorphous silicon.

8. The method according to claim 1, comprising forming the barrier layer at a thickness of about 10 Å to about 100 Å.

* * * * *